(12) United States Patent
Homma

(10) Patent No.: US 8,853,808 B2
(45) Date of Patent: Oct. 7, 2014

(54) RADIATION DETECTOR

(71) Applicants: Kabushiki Kaisha Toshiba, Tokyo (JP); Toshiba Electron Tubes & Devices Co., Ltd., Otawara (JP)

(72) Inventor: Katsuhisa Homma, Otawara (JP)

(73) Assignees: Kabushiki Kaisha Toshiba, Minato-ku, Tokyo (JP); Toshiba Electron Tubes & Devices Co., Ltd., Otawara-shi, Tochigi (JP)

( * ) Notice: Subject to any disclaimer, the term of this patent is extended or adjusted under 35 U.S.C. 154(b) by 0 days.

(21) Appl. No.: 13/956,982

(22) Filed: Aug. 1, 2013

(65) Prior Publication Data
US 2013/0313667 A1 Nov. 28, 2013

Related U.S. Application Data

(63) Continuation of application No. PCT/JP2012/000452, filed on Jan. 25, 2012.

(30) Foreign Application Priority Data

Feb. 1, 2011 (JP) .................................. 2011-019432

(51) Int. Cl.
| | |
|---|---|
| *H01L 27/14* | (2006.01) |
| *H01L 31/00* | (2006.01) |
| *G01T 1/24* | (2006.01) |
| *G01T 1/20* | (2006.01) |
| *H01L 31/0232* | (2014.01) |

(52) U.S. Cl.
CPC .......... *H01L 31/02322* (2013.01); *G01T 1/244* (2013.01); *G01T 1/2018* (2013.01)
USPC ............................. 257/428; 257/431; 257/433

(58) Field of Classification Search
CPC .. H01L 31/02322; G01T 1/244; G01T 1/2018
USPC .................. 257/414, 428, 431, 433, 443
See application file for complete search history.

(56) References Cited

U.S. PATENT DOCUMENTS

| | | |
|---|---|---|
| 6,262,422 B1 | 7/2001 | Homme et al. |
| RE40,291 E | 5/2008 | Homme et al. |

(Continued)

FOREIGN PATENT DOCUMENTS

| | | |
|---|---|---|
| CN | 1869732 A | 11/2006 |
| CN | 101002110 A | 7/2007 |

(Continued)

OTHER PUBLICATIONS

International Search Report issued in corresponding International Application No. PCT/JP2012/000452 mailed Feb. 28, 2012.

(Continued)

*Primary Examiner* — Hung Vu
(74) *Attorney, Agent, or Firm* — Banner & Witcoff, Ltd.

(57) ABSTRACT

According to one embodiment, a radiation detector includes a substrate, a scintillator layer, a moisture-proof body and an adhesive layer. The substrate is partitioned into at least an active area and a bonding area. The substrate includes a photoelectric conversion element located in the active area and configured to convert fluorescence to an electrical signal, an organic resin protective layer located at an outermost layer in the active area, and an inorganic protective film located at an outermost layer of the bonding area. The scintillator layer is formed on the organic resin protective layer so as to cover the photoelectric conversion element and configured to convert radiation to the fluorescence. The moisture-proof body is formed so as to cover the scintillator layer. The adhesive layer is formed on the inorganic protective film and bonds the moisture-proof body to the substrate.

6 Claims, 4 Drawing Sheets

(56) References Cited

U.S. PATENT DOCUMENTS

| | | | |
|---|---|---|---|
| 7,391,029 B2 * | 6/2008 | Takeda et al. | 250/370.11 |
| 7,514,686 B2 | 4/2009 | Ogawa et al. | |
| 7,982,190 B2 | 7/2011 | Homma et al. | |
| 8,280,005 B2 | 10/2012 | Suyama et al. | |
| 8,600,005 B2 | 12/2013 | Suyama et al. | |
| 2003/0015665 A1 | 1/2003 | Suzuki et al. | |
| 2007/0257198 A1 | 11/2007 | Ogawa et al. | |
| 2008/0099869 A1 * | 5/2008 | Izumi | 257/443 |
| 2010/0116997 A1 * | 5/2010 | Homma et al. | 250/368 |
| 2010/0119040 A1 | 5/2010 | Suyama et al. | |
| 2010/0224784 A1 | 9/2010 | Homma et al. | |
| 2010/0246758 A1 | 9/2010 | Hackenschmied et al. | |
| 2013/0044862 A1 | 2/2013 | Suyama et al. | |

FOREIGN PATENT DOCUMENTS

| | | |
|---|---|---|
| JP | 2009-128023 A | 6/2009 |
| JP | 2010-210580 A | 9/2010 |
| TW | 201022664 A | 6/2010 |
| WO | 98/36291 A1 | 8/1998 |

OTHER PUBLICATIONS

TW Notification of Examination Opinion dated Apr. 15, 2014 in corresponding TW Appln 101103271, English translation.

* cited by examiner

RADIATION DETECTOR

CROSS-REFERENCE TO RELATED APPLICATIONS

This is a continuation application of International Application PCT/JP2012/000452, filed on Jan. 25, 2012; the entire contents of which are incorporated herein by reference. This application also claims priority to Japanese Application No. 2011-019432, filed on Feb. 1, 2011. The entire contents of each are incorporated herein by reference.

FIELD

Embodiments described herein relate generally to a radiation detector.

BACKGROUND

As a new generation X-ray diagnostic detector, a planar X-ray detector based on an active matrix has been developed. By detecting X rays applied to this X-ray detector, an X-ray radiograph or a real-time X-ray image is outputted as a digital signal. In this X-ray detector, X rays are converted to visible light, i.e., fluorescence, by a scintillator layer. This fluorescence is converted to a signal charge by a photoelectric conversion element such as an amorphous silicon (a-Si) photodiode and CCD (charge coupled device) to obtain an image.

As the material of the scintillator layer, various materials are generally known, such as sodium-doped cesium iodide (CsI:Na), thallium-doped cesium iodide (CsI:Tl), sodium iodide (NaI), and gadolinium oxysulfide ($Gd_2O_2S$). Different materials are used depending on the purpose and required characteristics.

In the scintillator layer, grooves may be formed by dicing and the like, or a columnar structure may be deposited by evaporation technique. Thus, the resolution characteristics can be improved.

Above the scintillator layer, a reflective film may be formed for the purpose of enhancing fluorescence utilization efficiency to improve sensitivity characteristics. The reflective film is configured to increase fluorescence reaching the photoelectric conversion element side by reflecting the fluorescence emitted by the scintillator layer and directed opposite to the photoelectric conversion element side.

In an example known as a method for forming a reflective film, a metal layer having high fluorescent reflectance made of e.g. silver alloy or aluminum can be formed on the scintillator layer. In another example, a reflective film with light scattering reflectivity made of a light scattering material such as $TiO_2$ and a binder resin can be formed by coating. As an alternative method in practical use, instead of formation on the scintillator film, a reflective plate having a metal surface of e.g. aluminum can be brought into close contact with the scintillator layer to reflect fluorescence.

Furthermore, a moisture-proof structure is used for the purpose of protecting the scintillator layer and the reflective layer (or reflective plate and the like) from the external atmosphere to suppress characteristics degradation due to moisture and the like. The moisture-proof structure is an important component in providing the detector as a practical product. In particular, the CsI:Tl film and CsI:Na film are materials highly prone to degradation by moisture. In the case of using these films for the scintillator layer, high moisture-proof performance is required.

In a conventional moisture-proof structure, a hat-shaped moisture-proof body made of e.g. Al foil is adhesively sealed with the substrate in the peripheral portion to maintain the moisture-proof performance.

In this structure, the Al hat-shaped moisture-proof body is adhesively sealed with the substrate in the flange portion of the moisture-proof body. This structure is obviously superior in moisture-proof performance to that based on a moisture-proof body of an organic film made of e.g. polyparaxylene. Furthermore, most of the array substrate is covered with a conductive material. This also achieves a noise reduction effect by the shielding effect.

In the aforementioned radiation detector, pixels are formed in a matrix on the substrate. The pixel includes a photoelectric conversion element such as photodiode, and a switching element (TFT). The substrate is divided into an active area, a bonding area, a TAB pad section and the like. The active area is a pixel region on which the scintillator layer is formed. In the bonding area, the moisture-proof body covering the scintillator layer is bonded to the substrate via an adhesive layer. In the TAB pad section, the wiring from the active area is electrically connected to the circuit external to the substrate.

On the active area, a scintillator layer such as CsI:Tl film is formed by vacuum evaporation technique and the like. Here, the adhesion strength between the scintillator layer and the substrate is very important for the subsequent process and the reliability of the product after shipment. In the case where the adhesion strength is weak, the scintillator layer may be peeled from the substrate. This causes characteristics degradation and in-plane characteristics variation, being fatal to the product. In particular, a reflective film made of $TiO_2$ fine grains and binder resin may be formed by coating and drying on the scintillator layer. In this case, the scintillator layer is easily peeled from the substrate by the stress at the time of drying the reflective film and the stress due to thermal expansion difference between the states of the product at high temperature and low temperature. Thus, in view of ensuring this adhesion strength, the material of the substrate outermost layer to which the scintillator layer is attached is important.

On the other hand, in the bonding area, the material of the adhesive layer and the adhesion strength to the substrate are important. Naturally, this adhesion strength needs to be ensured at the initial state. Furthermore, long-term moisture-proof reliability also needs to be ensured by suppressing degradation in the high-temperature high-humidity state and cold-hot state. The degradation of adhesion strength leads to the degradation of moisture-proof sealing performance, and results in moisture permeation through the interface between the moisture-proof body and the adhesive layer, through the interface between the adhesive layer and the substrate, or from the adhesive layer itself. This causes characteristics degradation of the internal scintillator layer such as CsI:Tl film.

In general, the outermost layer material of the substrate suitable for ensuring the adhesion strength to the adhesive layer does not coincide with the outermost layer material of the substrate suitable for ensuring the adhesion strength to the scintillator layer such as CsI:Tl evaporated film. Thus, the conventional material used for the substrate outer layer is not insufficient for one or both of the adhesion strength to the scintillator layer and the adhesion strength to the moisture-proof body. This often leads to poor reliability in the cold-hot environment and high-temperature high-humidity environment.

BRIEF DESCRIPTION OF THE DRAWINGS

FIG. 3A is a plan view, and FIG. 3B is a side view;

DETAILED DESCRIPTION

According to one embodiment, a radiation detector includes a substrate, a scintillator layer, a moisture-proof body and an adhesive layer. The substrate is partitioned into at least an active area and a bonding area. The substrate includes a photoelectric conversion element located in the active area and configured to convert fluorescence to an electrical signal, an organic resin protective layer located at an outermost layer in the active area, and an inorganic protective film located at an outermost layer of the bonding area. The scintillator layer is formed on the organic resin protective layer so as to cover the photoelectric conversion element and configured to convert radiation to the fluorescence. The moisture-proof body is formed so as to cover the scintillator layer. The adhesive layer is formed on the inorganic protective film and bonds the moisture-proof body to the substrate.

Radiation detectors according to embodiments will be described hereinafter with reference to the accompanying drawings.

(General Structure of the Radiation Detector)

Figure 1:
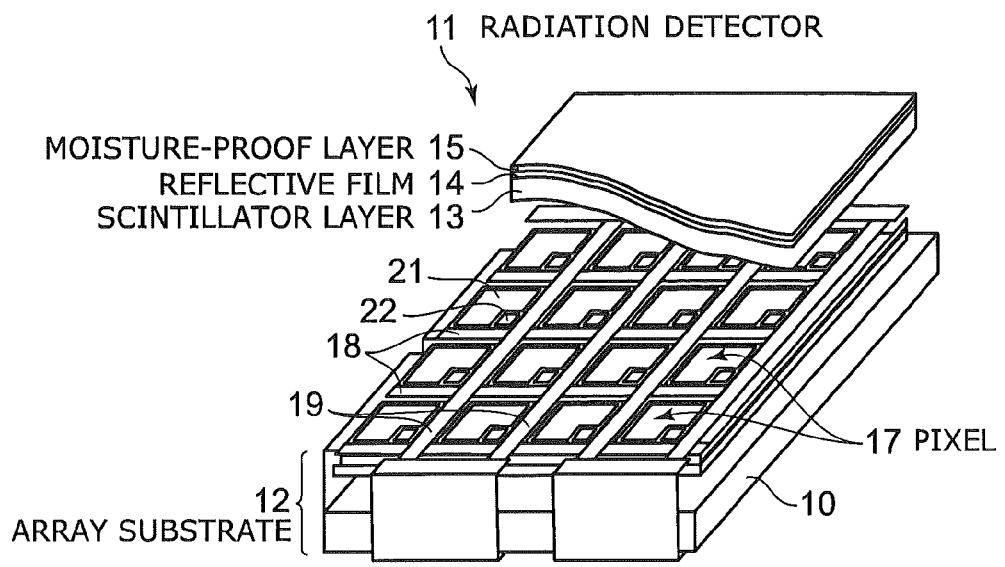
FIG. 1 is a perspective view showing a radiation detector according to an embodiment.
Figure 2:
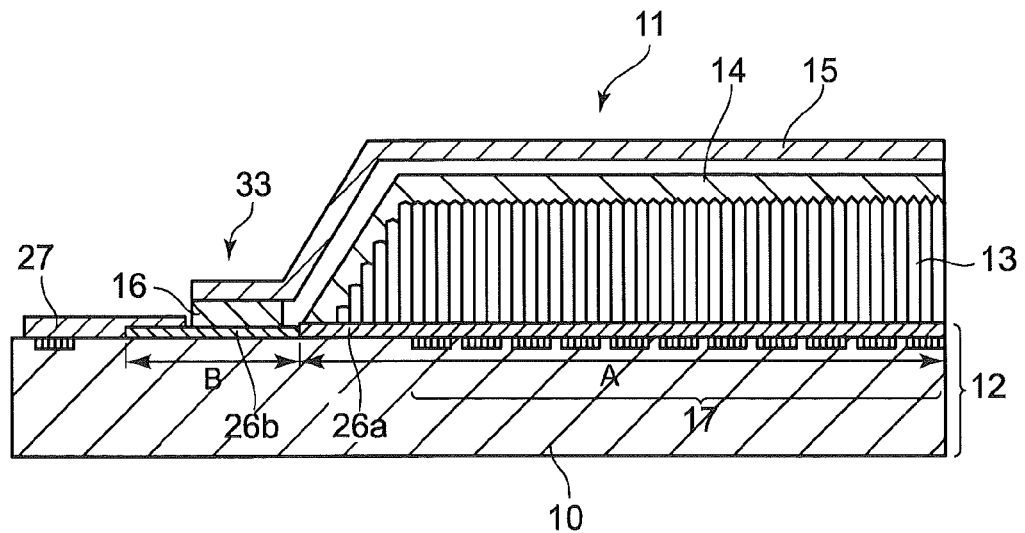
FIG. 2 is a sectional view of the radiation detector.

FIG. 1 is a perspective view of a radiation detector according to an embodiment. FIG. 2 is a sectional view of the radiation detector.

The radiation detector 11 is an X-ray planar sensor for detecting an X-ray image as a radiograph. The radiation detector 11 is used in e.g. general medical application.

As shown in FIGS. 1 and 2, this radiation detector 11 includes an array substrate 12, a scintillator layer 13, a reflective film 14, a moisture-proof body 15, and an adhesive layer 16. The array substrate 12 is a substrate on which a photoelectric conversion element for converting fluorescence to an electrical signal is formed. The scintillator layer 13 is provided on one major surface of this array substrate 12 and converts incident X rays to fluorescence. The reflective film 14 is provided on this scintillator layer 13 and reflects the fluorescence from the scintillator layer 13 to the array substrate 12 side. The moisture-proof body 15 is provided on the scintillator layer 13 and the reflective film 14 and protects them from outside air and moisture. The adhesive layer 16 bonds the moisture-proof body 15 to the array substrate 12.

(Array Substrate 12)

The array substrate 12 is configured so that the fluorescence converted from X rays to visible light by the scintillator layer 13 is converted to an electrical signal. The array substrate 12 includes a glass substrate 10, pixels 17 formed in a matrix on this glass substrate 10, a plurality of control lines (or gate lines) 18 provided along the row direction, a plurality of signal lines 19 provided along the column direction, a control circuit (not shown) electrically connected with each control line 18, and an amplifying/converting section (not shown) electrically connected with each signal line 19.

In each pixel 17, a photodiode 21 is provided as a photoelectric conversion element. These photodiodes 21 are provided below the scintillator layer 13.

Furthermore, each pixel 17 includes a thin film transistor (TFT) 22 as a switching element electrically connected to the photodiode 21, and a storage capacitor (not shown) as a charge storage section for storing a signal charge converted in the photodiode 21. However, the function of the storage capacitor may be served by the capacitance of the photodiode 21. Thus, the storage capacitor is not necessarily needed.

Each thin film transistor 22 is responsible for the switching function of storing and releasing the charge generated by the fluorescence incident on the photodiode 21. At least part of the thin film transistor 22 is made of a semiconductor material such as amorphous silicon (a-Si) as a noncrystalline semiconductor or polysilicon (P-Si) as a polycrystalline semiconductor.

The control line 18 shown in FIG. 1 is provided along the row direction between the pixels 17, and electrically connected to the gate electrodes (not shown) of the thin film transistors 22 of the pixels on the same row.

The signal line 19 shown in FIG. 1 is provided along the column direction between the pixels 17, and electrically connected to the source electrodes (not shown) of the thin film transistors 22 of the pixels on the same column.

The control circuit is configured to control the operating state, i.e., on/off, of each thin film transistor 22. The control circuit is implemented at the side edge along the row direction on the surface of the glass substrate 10.

The amplifying/converting section includes e.g. a plurality of charge amplifiers corresponding to the respective signal lines 19, a parallel/serial converter electrically connected with these charge amplifiers, and an analog-digital converter electrically connected with this parallel/serial converter.

(Protective Films 26a, 26b)

As shown in FIG. 2, on the active area A of the array substrate 12, a protective film 26a is formed to protect the pixels 17 and the like. As described later in Practical example 1, from the viewpoint of adhesiveness to the scintillator layer 13, this protective film 26a is formed from organic resin, preferably from a thermoplastic resin such as acrylic, polyethylene, polypropylene, and butyral resin, and most preferably from acrylic resin.

On the other hand, on the bonding area B of the array substrate 12 where the adhesive layer 16 is formed, a protective film 26b for improving adhesive strength is formed. As described later in Practical example 2, this protective film 26b is formed from an inorganic film.

(Scintillator Layer 13)

The scintillator layer 13 is configured to convert incident X rays to visible light, i.e., fluorescence. The scintillator layer 13 can be made of e.g. thallium-doped cesium iodide (CsI:Tl) or thallium-doped sodium iodide (NaI:Tl) by vacuum evaporation technique and formed in a columnar structure. Alternatively, the scintillator layer 13 can be formed as follows. Gadolinium oxysulfide ($Gd_2O_2S$) phosphor particles are mixed with a binder material. The mixture is applied onto the array substrate 12, and then sintered and cured. Then, grooves are formed by e.g. dicing with a dicer. Thus, the scintillator layer 13 is formed in a rectangular shape.

Between these columns, air or an antioxidant inert gas such as nitrogen ($N_2$) is encapsulated. Alternatively, the space between these columns can be evacuated.

For instance, the scintillator layer 13 can be made of an evaporated film of CsI:Tl. The film thickness can be approximately 600 μm. The thickness of the column (pillar) of the columnar structure of the CsI:Tl crystal can be approximately 8-12 µm at the outermost surface.

(Reflective Film 14)

The reflective film 14 formed on the scintillator layer 13 is configured to reflect the fluorescence emitted to the side opposite from the photodiode, thereby increasing the amount of fluorescence reaching the photodiode.

The reflective film 14 can be formed as follows. A film of a metal having high fluorescent reflectance such as silver alloy and aluminum can be formed on the scintillator layer 13. Alternatively, a reflective plate having a metal surface of e.g. aluminum can be brought into close contact with the scintillator layer 13. Further alternatively, a reflective layer with diffusive reflectivity made of a light scattering material such as $TiO_2$ and a binder resin can be formed by coating.

Specifically, as a light reflective material, $TiO_2$ fine power having an average grain diameter of approximately 0.3 µm is mixed in a solvent with a binder resin such as butyral resin. Then, the mixture is applied and dried on the scintillator layer 13. The application can be performed by e.g. using a dispenser and driving an XY stage to repeat line coating. Thus, the coating can be formed in an area shape.

Here, the reflective film 14 can be omitted depending on the characteristics required for the radiation detector 11, such as resolution and brightness.

(Moisture-Proof Body 15)

The moisture-proof body 15 is configured to protect the scintillator layer 13 and the reflective film 14 from outside atmosphere, thereby suppressing characteristics degradation due to moisture and the like.

Figure 3A:
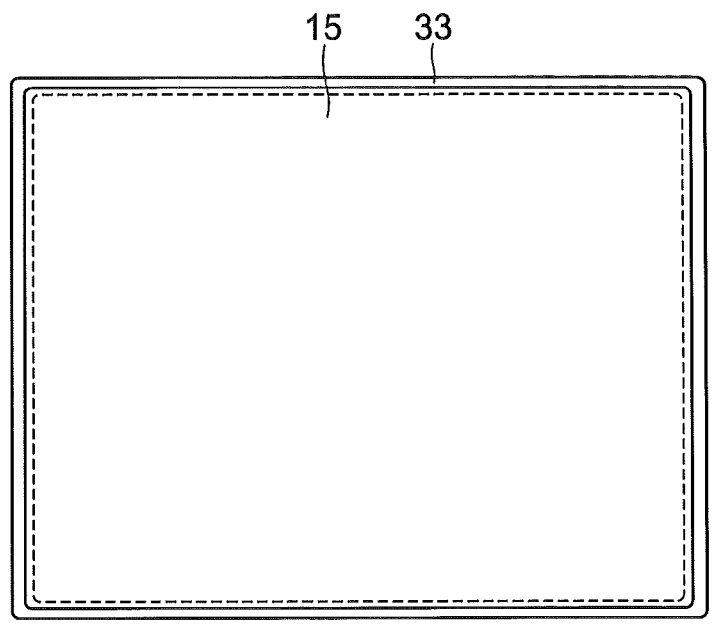
FIGS. 3A and 3B are schematic views of an AL hat as a moisture-proof body of the radiator detector.
Figure 3B:
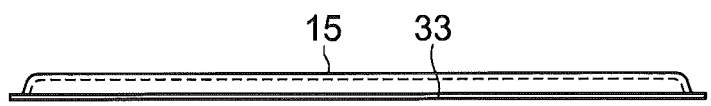

The moisture-proof body 15 is formed in e.g. a hat shape as follows. An Al alloy foil (A1N30-O material) having a thickness of 0.1 mm is press molded into a structure having a flange portion 33 with a width of 5 mm in the peripheral portion (see FIGS. 3A and 3B). The material of the moisture-proof body 15 is not limited to Al (aluminum) or Al alloy. A material having low moisture permeability (high barrier capability to water vapor) can be used, such as a stacked film of Al or Al alloy with resin, and a stacked film of an inorganic film with resin (e.g., GX film manufactured by Toppan Printing Co., Ltd.).

(Adhesive Layer 16)

The adhesive layer 16 is formed by applying an adhesive containing an additive to the flange portion 33. More specifically, in order to adhesively seal the flange portion 33 to the peripheral region of the array substrate 12, for instance, the Al hat is turned upside down and placed on a bonding tray. Then, the flange portion 33 is cleaned with acetone and the like. Furthermore, $UV/O_3$ treatment is performed. Then, an adhesive is applied by a dispenser. Thus, the adhesive layer 16 can be formed.

As described later, the adhesive can be an UV curable adhesive (XNR5516ZHV-B1 manufactured by Nagase ChemteX Corporation, viscosity: 400 Pa·s).

(Lamination of the Moisture-Proof Body 15 with the Array Substrate 12)

The moisture-proof body 15 is laminated with the array substrate 12 as follows, for instance. The adhesive is applied to the flange portion 33 of the Al hat. Then, the array substrate 12 is turned upside down and positionally aligned. In this state, they are placed in a low-pressure lamination apparatus, and the chamber is closed. In the low-pressure state, the Al hat and the array substrate 12 are united. Thus, the moisture-proof body 15 made of the Al hat is low-pressure laminated with the film-attached array substrate 12 in the bonding area B shown in FIG. 2. Next, by UV irradiation from the rear surface side of the substrate, the adhesive is cured. Then, heat curing of 60° C.×3 hours is further performed.

With regard to the size of the substrate used, for e.g. 17 inches square, the region of the active area A to be evaporated with a CsI:Tl film can be set to generally 430 mm square. The region of the bonding area B to be adhesively sealed with the moisture-proof body 15 of the Al hat can be set to approximately 440-450 mm square.

Effect of the Embodiment

In the array substrate 12, the substrate outermost layer of the active area A to be coated with the scintillator layer 13 is configured as a protective film 26a of organic resin. This can ensure the adhesion strength between the scintillator layer 13 and the array substrate 12. As a result, in the subsequent process for manufacturing a reflective film 14, the phenomenon of peeling of the scintillator film due to the stress of the reflective film can be made less likely to occur. Furthermore, even in the high-temperature high-humidity environment and an environment of rapidly changing temperature, high adhesion strength between the scintillator layer 13 and the array substrate 12 is maintained. Thus, a product with high reliability can be obtained.

On the other hand, in the array substrate 12, in the bonding area B on which the adhesive layer 16 is to be formed, the outermost layer is configured as a protective film 26b of inorganic material. This can enhance the adhesion strength between the adhesive layer 16 and the array substrate 12, and also suppress degradation due to high temperature and high humidity. As a result, with regard to the sealing portion of the moisture-proof structure, high reliability can be ensured.

Thus, the embodiment can provide a radiation detector 11 having high reliability in both the adhesion strength between the scintillator layer 13 and the array substrate 12, and the adhesion strength between the adhesive layer 16 of the moisture-proof body 15 and the array substrate 12.

Other Embodiments

Figure 4:
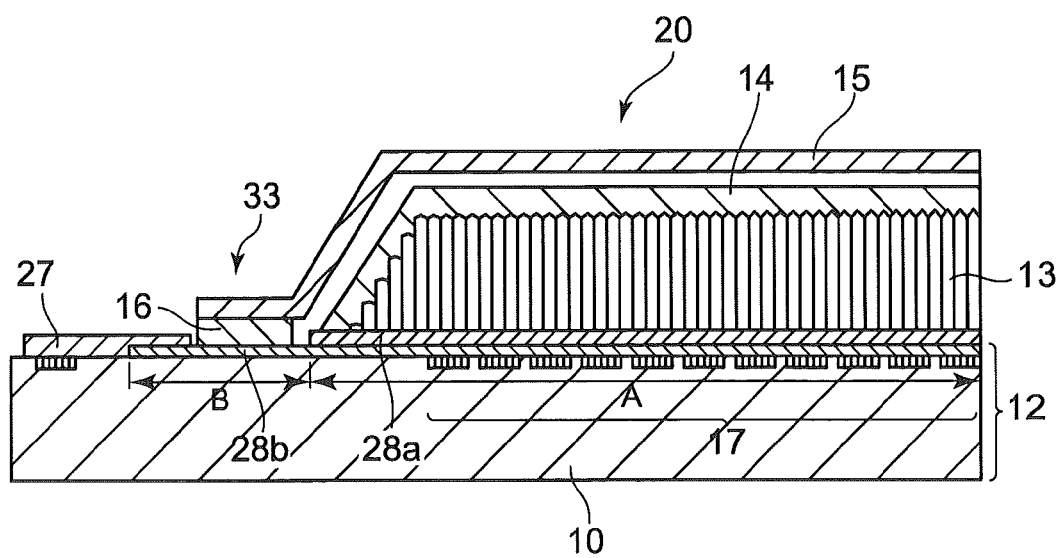
FIG. 4 is a sectional view showing a radiator detector according to another embodiment.
Figure 5:
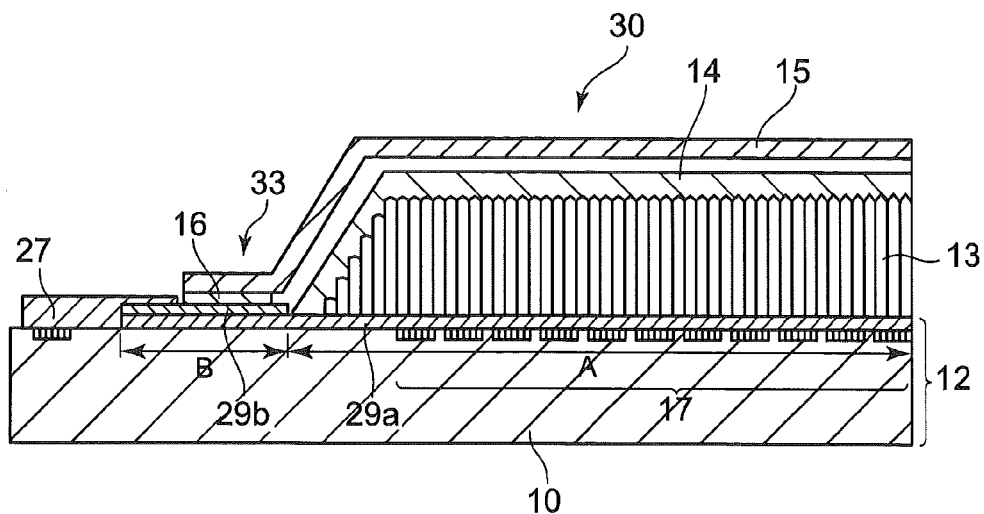
FIG. 5 is a sectional view showing a radiator detector according to still another embodiment.

FIGS. 4 and 5 show other embodiments with alternative configurations of the protective film in the outermost layer of the array substrate 12.

In the radiation detector 20 shown in FIG. 4, a protective film 28b of inorganic material is formed over both the active area A and the bonding area B on the array substrate 12. Furthermore, in the region of the active area A, a protective film 28a of organic resin is formed on the inorganic protective film 28b. The rest of the configuration is similar to that of the radiation detector 11 shown in FIG. 2.

In the radiation detector 30 shown in FIG. 5, a protective film 29a of organic resin is formed over both the active area A and the bonding area B on the array substrate 12. Furthermore, in the region of the bonding area B, a protective film 29b of inorganic material is formed on the protective film 29a of organic resin. The rest of the configuration is similar to that of the radiation detector 11 shown in FIG. 2.

These radiation detectors 20 and 30 can also achieve effects similar to those of the radiation detector 11.

EXAMPLES

Practical Example 1

Evaluation of Adhesion Strength Between the Outermost Layer of the Array Substrate 12 and the Scintillator Layer 13

The influence of different outermost protective films of the array substrate 12 on the adhesion strength to the scintillator layer 13 was investigated as follows.

First, the adhesion strength to the scintillator layer 13 was measured. To this end, the substrate was covered with an outermost protective film material made of silicone-based organic film. Then, a CsI:Tl film was evaporated thereon to a thickness of 600 µm, with the film formation temperature of the substrate set to approximately 150° C.

After the evaporated film was formed, two reflective films were prepared as the reflective film 14 in actual use made of $TiO_2$ reflective grains, binder material, and solvent. The two reflective films were reflective film A ($TiO_2$ fine grains, butyral resin binder, organic solvent) and reflective film B ($TiO_2$ fine grains, butyral resin binder, plasticizer, organic solvent). These coating liquids were dropped with three levels of weight (dry weight: 32 mg, 63 mg, 95 mg) using a dispenser apparatus. Then, the peeling state between the CsI:Tl film and the substrate due to the contraction stress at the time of drying was investigated.

Figure 6:
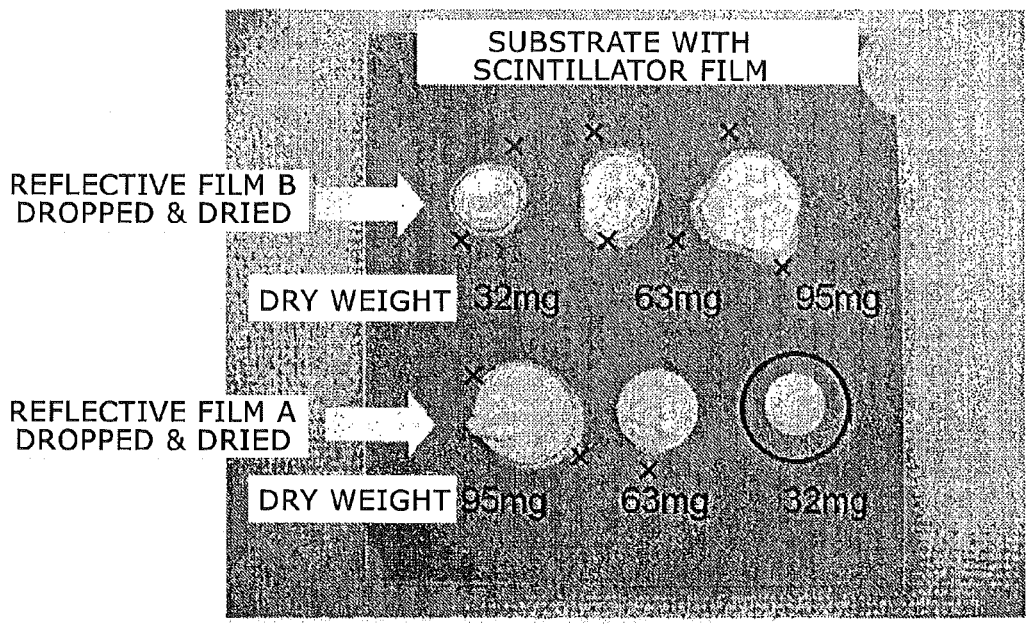
FIG. 6 is a plan view showing a result of a practical example 1.

The result is shown in FIG. 6.

As clearly seen in FIG. 6, in the reflective film A with a dry weight of 63 mg and 95 mg, and the reflective film B with a dry weight of 32 mg, 63 mg, and 95 mg, the CsI:Tl film was floated from the substrate at the site of "x" in the figure. In contrast, in the reflective film A with a dry weight of 32 mg, no floating of the CsI:Tl film from the substrate was observed.

As another measurement, the reflective film A was used as the reflective film. As the outermost layer material of the substrate, acrylic, silicone, Si—N, and Si—O protective films were used. The $UV/O_3$ treatment, expected to be effective for the adhesion strength, was performed in advance at three levels of weak, medium, and strong. Then, the ratio of peeling between the CsI:Tl film as a scintillator and the substrate was measured. The result is shown in TABLE 1.

TABLE 1

Fixed amount drop of reflective film coating liquid and scintillator film peeling after drying

| Outermost layer material | Acrylic | | | Silicone | | | Si—N | | | Si—O | | |
|---|---|---|---|---|---|---|---|---|---|---|---|---|
| $UV/O_3$ treatment | W | M | S | W | M | S | W | M | S | W | M | S |
| Ratio of scintillator layer/substrate peeling | 0/3 | 0/3 | 0/3 | 2/3 | 0/3 | 1/3 | 3/3 | 3/3 | 3/3 | 3/3 | 3/3 | 3/3 |

$UV/O_3$ treatment: W/Weak, M/Medium, S/Strong

From the result of the above table, it was found that the substrate outermost layer made of organic resin, particularly acrylic, is superior in the adhesion strength of the scintillator to that made of inorganic film material.

Although not shown in TABLE 1, in the case where the outermost layer of the substrate is an organic resin layer, the resin is not limited to acrylic resin. Thermoplastic resins such as polyethylene, polypropylene, and butyral resins were also superior in the adhesion strength of the scintillator to thermosetting resins such as silicone and epoxy resins.

As described above, with regard to the adhesion strength to the scintillator layer 13 such as CsI:Tl film, it was found that the resin-based protective film is clearly advantageous. Furthermore, among the resin-based protective films, thermoplastic organic resins such as acrylic resin were superior to thermosetting organic resins such as silicone resin.

The reason for this is presumed as follows. Evaporation of a CsI:Tl film involves substrate heating to e.g. approximately 150° C. Thus, at the time of evaporation, the substrate outer layer is softened. This achieves the effect of relaxing stress and ensuring adhesion strength between the evaporated film and the outer layer. Here, most acrylic resins have a softening point of approximately 120° C.

On the other hand, with regard to the thermosetting silicone resin, at a temperature of approximately 150° C. at the time of evaporation of a CsI:Tl film, curing proceeds to some extent, or even if curing does not proceed, the resin is not softened like thermoplastic resin. Thus, it is considered that a sufficient adhesion strength is not difficult to achieve at the energy of the evaporated film.

Furthermore, from the viewpoint of the scintillator layer 13, an evaporated film of CsI:Tl or CsI:Na exhibits a pillar structure (columnar crystal structure), with a gap between the pillars. Thus, such an evaporated film has good resolution characteristics due to the light guide effect. However, mutual support in the in-plane direction of the film is weak. Thus, such an evaporated film tends to be inferior in the adhesion strength to the array substrate 12.

Accordingly, in the case of the scintillator layer 13 of such a pillar structure, as in this embodiment, a greater effect is achieved by the configuration in which the active area with the scintillator layer 13 formed thereon is made of an organic resin protective film.

Practical Example 2

Evaluation of Adhesion Strength Between the Adhesive Layer 16 of the Moisture-Proof Body 15 and the Array Substrate 12

The adhesion strength between the adhesive layer 16 of the moisture-proof body 15 and the array substrate 12 was evaluated by fabricating adhesion strength samples having the following structure. A substrate with a protective layer material formed on the surface was divided into small pieces. Then, the piece was laminated with the protective layer sides opposed to each other across an adhesive.

As the adhesive, UV curable adhesive XNR5516ZHV-B1 manufactured by Nagase ChemteX Corporation was used. Furthermore, the $UV/O_3$ treatment, expected to be effective for the adhesion strength, was performed in advance.

Figure 7:
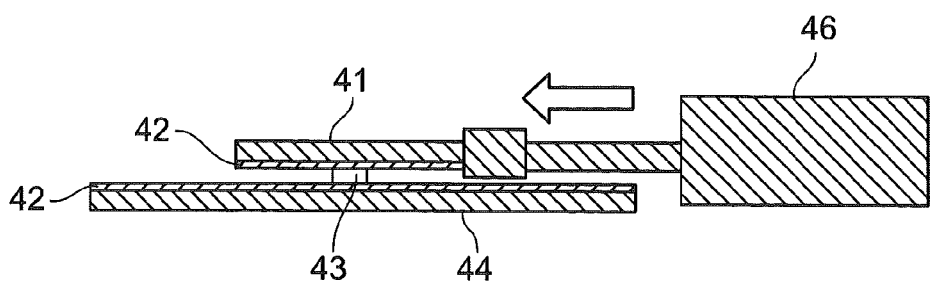
FIG. 7 is a measurement method of a practical example 2.

As shown in FIG. 7, a prescribed protective layer 42 was formed on the surface of the small-piece substrate 41 having a size of 2 mm×5 mm. An adhesive of approximately 1 mg was applied onto the small-piece substrate 41 by a dispenser. On the other hand, the same protective layer 42 was formed on a medium-piece substrate 44 of 4 cm square. The small-piece substrate 41 and the medium-piece substrate 44 were opposed and laminated to each other with the adhesive therebetween, which constitutes an adhesive layer 43. After pressurization with a weight of approximately 200 gf, UV of 365 nm was applied from the rear surface side of the small-piece substrate 41 at 3 $J/cm^2$ for curing. Then, heat curing of 60° C.×3 hours was performed. The adhesion strength to the adhesive layer 43 was measured using a digital force gauge 46 shown in FIG. 7. In the measurement, the small-piece substrate 41 was pushed from the side surface. The measurement was performed in the mode of holding the peak strength at the time of peeling of the small piece. In this adhesion strength investigation, the adhesion strength change by the high-temperature high-humidity test at 60° C.-90% RH was also traced.

Figure 8:
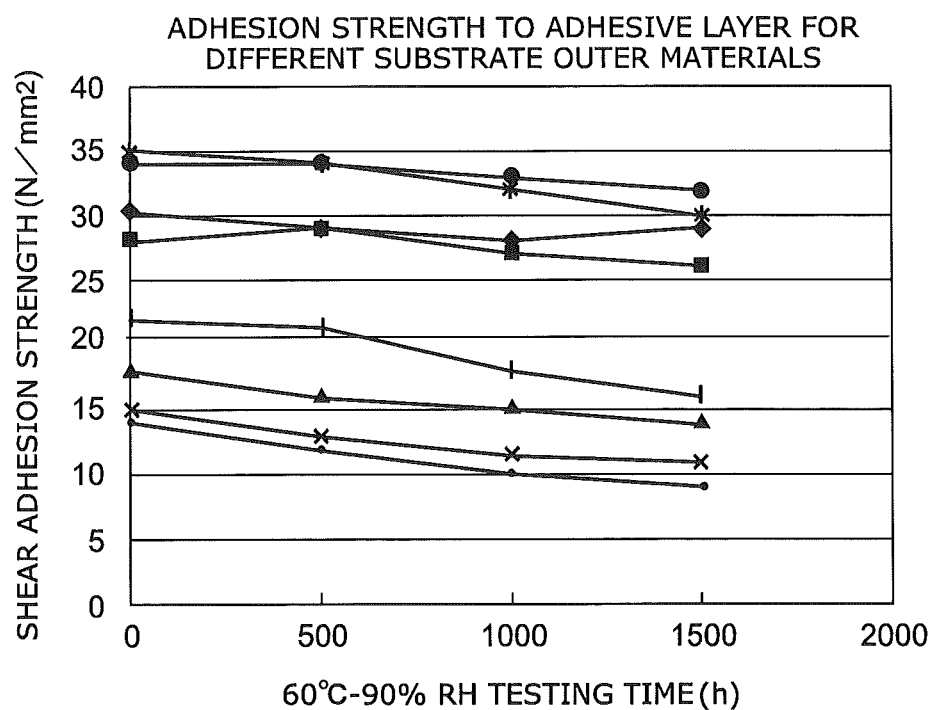
FIG. 8 is a graph showing a result of measurement.

FIG. 8 shows the result of measuring the adhesion strength between the small-piece substrate 41 and the adhesive layer 43 for various materials used for the protective layer 42. Here, adhesive A and adhesive B are both epoxy-based UV curable adhesives, but different in the kind and added amount of additive and filler.

The result of the adhesion strength to the adhesive layer 43 was clearly different from the trend of the adhesion strength between the scintillator layer 13 and the array substrate 12 in Practical example 1. The outermost layer of the substrate made of the inorganic protective film was clearly superior to that made of the organic protective film.

Furthermore, also in the high-temperature high-humidity test at 60° C.-90% RH, it was found that the degradation of adhesion strength for the inorganic protective film was small, and superior to that for the organic resin protective film.

Practical Example 3

Characteristics Evaluation in the Radiation Detector

Based on the results of Practical examples 1 and 2, an actual radiation detector was manufactured for different protective film materials of the outermost layer of the array substrate 12 as follows.

First, for this Practical example, the radiation detector 20 having the structure shown in FIG. 4 was fabricated.

On the array substrate 12, as a protective film 28b, an inorganic film of silicon nitride having a film thickness of approximately 2 μm was formed by plasma CVD technique. Then, as a protective film 28a, an acrylic resin film having a thickness of approximately 2.5 μm was formed on the protective film 28b. As the acrylic resin film, a photosensitive resin film was used. The pattern design was configured so that the acrylic resin film in the bonding area B is removed directly by photolithography.

By this process, in the active area A on which the CsI:Tl scintillator layer 13 is to be formed, the protective film 28a of acrylic resin-based organic resin constitutes the uppermost layer. In the bonding area B to the moisture-proof body 15, the protective film 28b of silicon nitride-based inorganic material constitutes the uppermost layer.

On the other hand, samples of comparative examples were simultaneously fabricated as follows. In one sample, a protective film of organic resin was left on the entire surface except for the TAB pad section 27 and the like (Comparative example 1). In another sample, a protective film of inorganic material was left on the entire surface (Comparative example 2).

TABLE 2 lists the uppermost layer materials of the array substrate of the trial samples. The other components and processes were made common to Practical example and Comparative examples 1 and 2.

TABLE 2

Materials of the uppermost protective film of trial samples

|  | Practical example | Comparative example 1 | Comparative example 2 |
| --- | --- | --- | --- |
| Active area A | Acrylic organic film | Acrylic organic film | Silicon nitride inorganic film |
| Bonding area B | Silicon nitride inorganic film | Acrylic organic film | Silicon nitride inorganic film |

In the manufacturing process, after the reflective film 14 was applied, at the drying stage, in the sample of Comparative example 2, film floating (the state in which peeling occurs and produces a gap) occurred between the CsI:Tl film of the scintillator layer 13 and the surface of the array substrate 12. This state of film floating was such that the film was peeled off even by small vibration. The film failed to withstand the subsequent process.

In contrast, the samples of this Practical example and Comparative example 1 were free from trouble in the process of forming the reflective film 14. Then, the samples were successfully advanced to the step of adhesively sealing the Al hat. In both of these samples, low-pressure lamination was performed. UV curing and heat curing were also completed without particular trouble.

Then, in order to compare the reliability of these samples, a high-temperature high-humidity test at 60° C.-90% RH×500 h, and a cold-hot cycle test of −20° C.×2 h/60° C.×2 h were performed. As a result, in the sample of Comparative example 1, near two corner portions, peeling occurred in the bonding portion between the Al hat and the array substrate 12. The peeling portion was investigated. As a result, it was found that peeling occurred at the interface between the adhesive layer 16 and the array substrate 12.

On the other hand, in the sample of Practical example, no trouble was found in the bonding portion. The high-temperature high-humidity test and the cold-hot test were further added. That is, the test of 60° C.-90% RH×total 1000 h was performed, and the cold-hot test of −20° C.×2 h/60° C.×2 h was repeated a total of 60 times. Even after these tests, no trouble occurred in the adhesive sealing portion.

This result is also in agreement with the result of Practical example 2 described above. In the configuration of Practical examples, a protective film of silicon nitride is used for the outermost layer of the array substrate 12. It is considered that this configuration made the sample of Practical examples clearly superior to the sample of Comparative example 1 in the adhesion strength to the adhesive layer 16 and its high-temperature high-humidity resistance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector comprising:
a substrate partitioned into at least an active area and a bonding area, the substrate including a photoelectric conversion element located in the active area and configured to convert fluorescence to an electrical signal, an organic resin protective layer located at an outermost layer in the active area, and an inorganic protective film located at an outermost layer of the bonding area;
a scintillator layer formed on the organic resin protective layer so as to cover the photoelectric conversion element and configured to convert radiation to the fluorescence;
a moisture-proof body formed so as to cover the scintillator layer; and
an adhesive layer formed on the inorganic protective film and bonding the moisture-proof body to the substrate.

2. The detector according to claim 1, wherein the organic resin protective layer is formed from a thermoplastic organic resin.

3. The detector according to claim 1, wherein the inorganic protective film is formed from one of silicon nitride, silicon oxide, silicon carbide, and a composite material thereof.

4. The detector according to claim 3, wherein the adhesive layer is formed from a UV curable adhesive.

5. The detector according to claim 1, wherein the adhesive layer is formed from a UV curable adhesive.

6. The detector according to claim 1, further comprising:
a reflective film formed between the scintillator layer and the moisture-proof body and configured to reflect the fluorescence.

* * * * *